(12) United States Patent
Sasaki et al.

(10) Patent No.: US 9,312,151 B2
(45) Date of Patent: Apr. 12, 2016

(54) METHOD OF MANUFACTURING SEMICONDUCTOR DEVICE AND METHOD OF MANUFACTURING ELECTRONIC DEVICE INCLUDING AN ADHESIVE LAYER ON A SUPPORT MEMBER

(71) Applicant: FUJITSU LIMITED, Kawasaki-shi, Kanagawa (JP)

(72) Inventors: Shinya Sasaki, Ebina (JP); Yoshikatsu Ishizuki, Yokohama (JP); Motoaki Tani, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 279 days.

(21) Appl. No.: 13/749,159

(22) Filed: Jan. 24, 2013

(65) Prior Publication Data

US 2013/0217189 A1 Aug. 22, 2013

(30) Foreign Application Priority Data

Feb. 17, 2012 (JP) ................................. 2012-032297

(51) Int. Cl.
*H01L 21/58* (2006.01)
*H01L 23/00* (2006.01)
*H01L 21/683* (2006.01)
*H01L 23/31* (2006.01)
*H01L 21/56* (2006.01)

(52) U.S. Cl.
CPC .............. *H01L 21/58* (2013.01); *H01L 21/568* (2013.01); *H01L 21/6835* (2013.01); *H01L 24/19* (2013.01); *H01L 24/20* (2013.01); *H01L 24/96* (2013.01); *H01L 21/561* (2013.01); *H01L 23/3128* (2013.01); *H01L 2221/68318* (2013.01); *H01L 2221/68381* (2013.01); *H01L 2224/04105* (2013.01); *H01L 2224/12105* (2013.01); *H01L 2224/24195* (2013.01); *H01L 2924/10253* (2013.01); *H01L 2924/15787* (2013.01); *H01L 2924/15788* (2013.01); *H01L 2924/19105* (2013.01)

(58) Field of Classification Search
None
See application file for complete search history.

(56) References Cited

U.S. PATENT DOCUMENTS 5,915,170 A * 6/1999 Raab et al. .................... 438/118
7,112,467 B2 * 9/2006 Eichelberger et al. ........ 438/106

(Continued)

FOREIGN PATENT DOCUMENTS

CN 102097341 A 6/2011
CN 102134453 A 7/2011

(Continued)

OTHER PUBLICATIONS

Chinese Office Action for the Corresponding CN Application No. 201310048766.2, mailed on Apr. 3, 2015, with full translation.

(Continued)

*Primary Examiner* — Scott B Geyer
(74) *Attorney, Agent, or Firm* — Kratz, Quintos & Hanson, LLP

(57) ABSTRACT

A method of manufacturing a semiconductor device, includes: providing a first adhesive layer on a support member; providing a film on the first adhesive layer; arranging a semiconductor element on the film; providing a resin layer on the film on which the semiconductor element is arranged, and forming a substrate including the semiconductor element and the resin layer on the film; and separating the film and the substrate from the first adhesive layer.

14 Claims, 18 Drawing Sheets

(56) References Cited

U.S. PATENT DOCUMENTS

| | | | |
|---|---|---|---|
| 7,163,843 B2* | 1/2007 | Kiendl et al. | 438/114 |
| 7,202,107 B2 | 4/2007 | Fuergut | |
| 7,943,423 B2* | 5/2011 | Pohl et al. | 438/112 |
| 8,860,211 B2* | 10/2014 | Kon | 257/713 |
| 2002/0011655 A1 | 1/2002 | Nishiyama | |
| 2003/0017663 A1 | 1/2003 | Takyu et al. | |
| 2005/0230776 A1 | 10/2005 | Kountz et al. | |
| 2006/0128063 A1 | 6/2006 | Yamano | |
| 2006/0183269 A1 | 8/2006 | Fuergut | |
| 2007/0145555 A1 | 6/2007 | Fuergut et al. | |
| 2007/0218651 A1* | 9/2007 | Higashino | 438/460 |
| 2009/0039496 A1* | 2/2009 | Beer et al. | 257/693 |
| 2010/0195299 A1 | 8/2010 | Souriau et al. | |
| 2011/0143501 A1* | 6/2011 | Oda et al. | 438/127 |
| 2011/0143552 A1 | 6/2011 | Yanagi et al. | |
| 2011/0151625 A1* | 6/2011 | Hoshino et al. | 438/118 |
| 2011/0215461 A1 | 9/2011 | Iijima | |
| 2013/0217189 A1 | 8/2013 | Sasaki et al. | |

FOREIGN PATENT DOCUMENTS

| | | |
|---|---|---|
| JP | 2001-308116 A1 | 11/2001 |
| JP | 2002-124527 A1 | 4/2002 |
| JP | 2002-299500 A1 | 10/2002 |
| JP | 2003-17513 A1 | 1/2003 |
| JP | 4403631 B2 | 1/2010 |
| JP | 2011-187551 A1 | 9/2011 |
| TW | 546813 B | 8/2003 |
| TW | 201130945 A1 | 9/2011 |
| TW | 201140709 A | 11/2011 |

OTHER PUBLICATIONS

Office Action of Taiwanese Patent Application No. 102104165 dated Dec. 23, 2014 with whole translated Office Action.

US Office Action of U.S. Appl. No. 13/749,126 dated Apr. 15, 2015.

Office Action of Taiwanese Patent Application No. 102104345 dated Jul. 14, 2015, with full translation. Cited in IDS filed Sep. 9, 2015 for U.S. Appl. No. 13/749,126.

\* cited by examiner

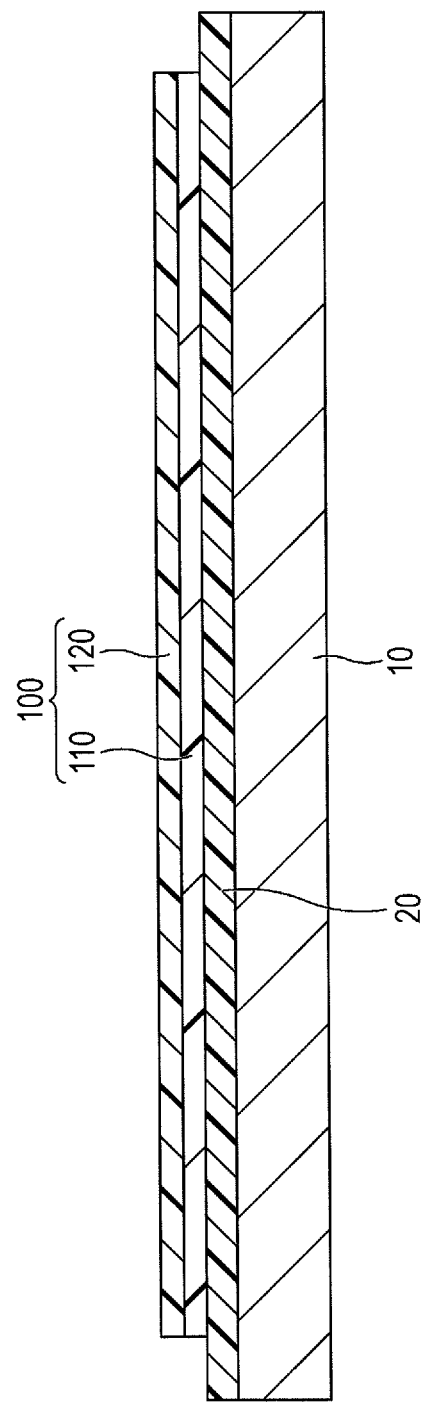

METHOD OF MANUFACTURING SEMICONDUCTOR DEVICE AND METHOD OF MANUFACTURING ELECTRONIC DEVICE INCLUDING AN ADHESIVE LAYER ON A SUPPORT MEMBER

CROSS-REFERENCE TO RELATED APPLICATION(S)

This application is based upon and claims the benefit of priority of the prior Japanese Patent Application No. 2012-032297, filed on Feb. 17, 2012, the entire contents of which are incorporated herein by reference.

FIELD

The embodiment discussed herein is related to a method of manufacturing a semiconductor device and a method of manufacturing an electronic device.

BACKGROUND

A wafer level package (WLP) is known as an example of a semiconductor package (semiconductor device) that includes a semiconductor element (electronic component), such as a bare chip. A WLP is also called a wafer-level chip size package (WL-CSP) or a wafer chip size package (W-CSP). A WLP enables terminals located at an end of a bare chip to be rearranged in a chip area (i.e., fan-in). Furthermore, a WLP that enables terminals to be rearranged outside a chip area (i.e., fan-out) is also being developed, because it becomes difficult to rearrange the terminals within the chip area as the number of the terminals of a bare chip increases.

In a known method of manufacturing such semiconductor packages, semiconductor elements are attached to an adhesive sheet or adhesive layer, which is composed of an adhesive material, provided on a support member and are sealed with resin to form a pseudo wafer; the pseudo wafer is separated from the adhesive layer; a wiring layer is formed on a surface of the pseudo wafer separated from the adhesive layer; and the pseudo wafer is diced.

Thus, individual semiconductor packages are obtained. In this manufacturing method, the pseudo wafer is separated from the adhesive layer by reducing the adhesion of the adhesive layer through, for example, ultraviolet irradiation, chemical treatment, or heating treatment.

In another known method, the adhesive layer is composed of an adhesive material that has release properties and solvent solubility effective against the resin used to seal the semiconductor elements.

Examples of related art are as follows: U.S. Pat. No. 7,202, 107B2 specification, Japanese Patent No. 4403631, and Japanese Laid-open Patent Publication No. 2002-299500.

In a method of separating, from an adhesive layer, a pseudo wafer (substrate) formed on the adhesive layer, the adhesive layer may be subjected to ultraviolet irradiation, chemical treatment, or heating treatment to reduce the adhesion of the adhesive layer.

Once the adhesion of an adhesive layer is reduced, however, it is difficult to reuse the adhesive layer, and a new adhesive layer is used every time a pseudo wafer is formed. Accordingly, it is difficult to reduce man-hours and cost for manufacturing a semiconductor device (semiconductor package). In addition, using the semiconductor device manufactured as described above may increase costs of electronic devices.

SUMMARY

According to an aspect of the invention, a method of manufacturing a semiconductor device, includes: providing a first adhesive layer on a support member; providing a film on the first adhesive layer; arranging a semiconductor element on the film; providing a resin layer on the film on which the semiconductor element is arranged, and forming a substrate including the semiconductor element and the resin layer on the film; and separating the film and the substrate from the first adhesive layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 illustrates an example of a manufacturing process of a semiconductor device (part 1);

DESCRIPTION OF EMBODIMENT

Figure 1A:
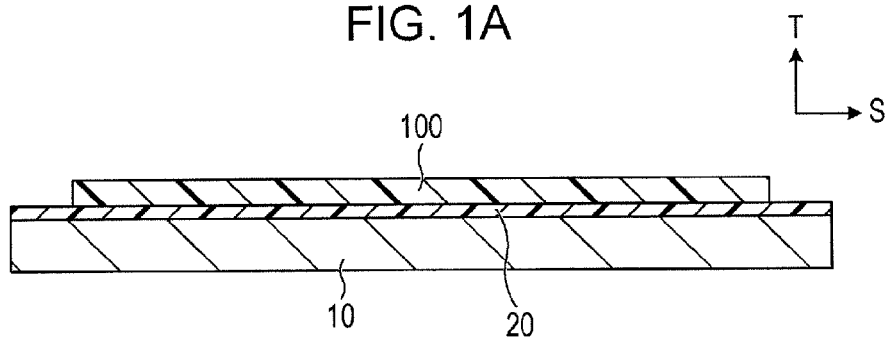
FIGS. 1A to 1C illustrate an example of a method of manufacturing a semiconductor device (part 1)
Figure 1B:
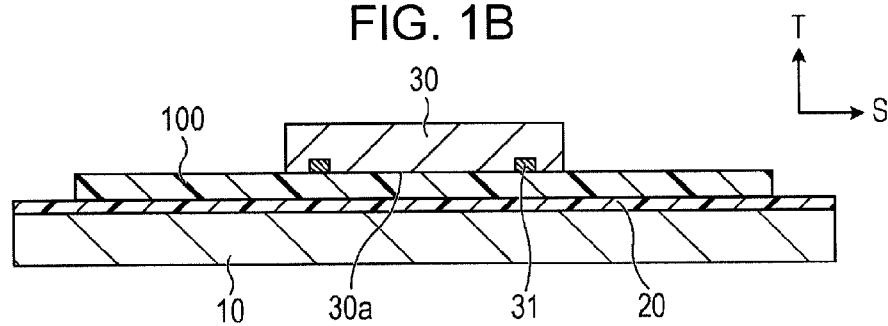
Figure 1C:
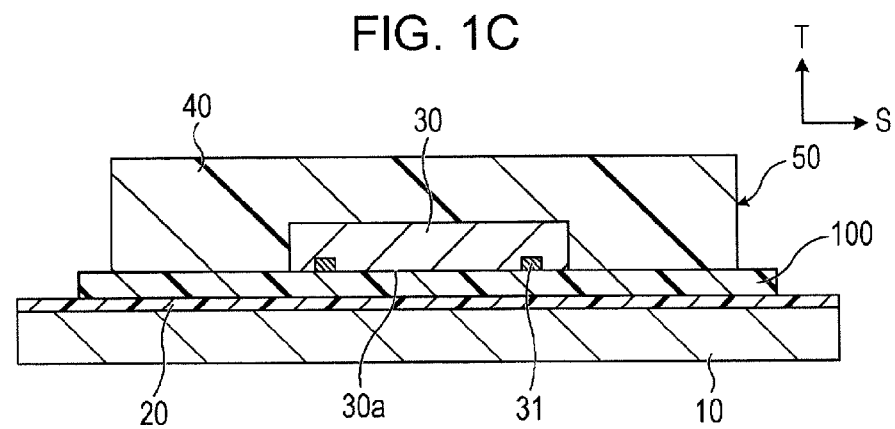
Figure 2A:
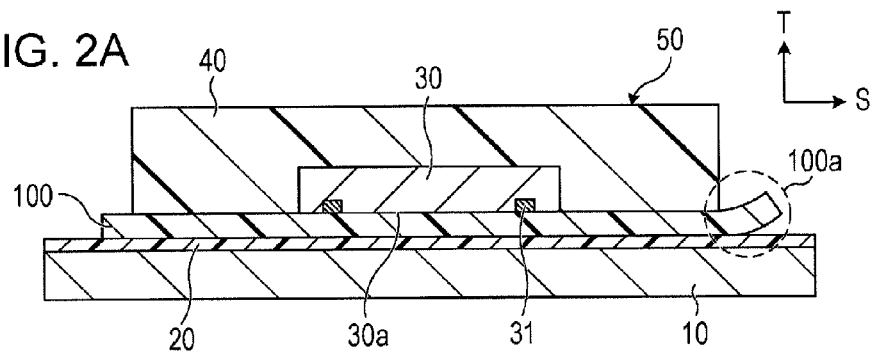
FIGS. 2A to 2D illustrate an example of a method of manufacturing a semiconductor device (part 2)
Figure 2B:
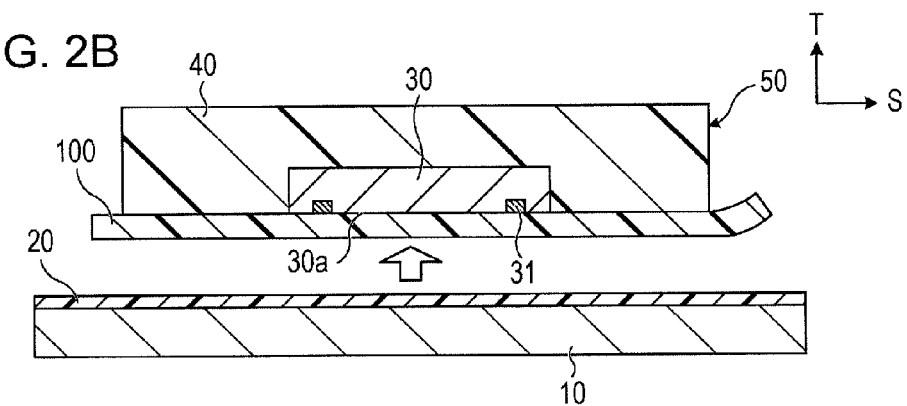
Figure 2C:
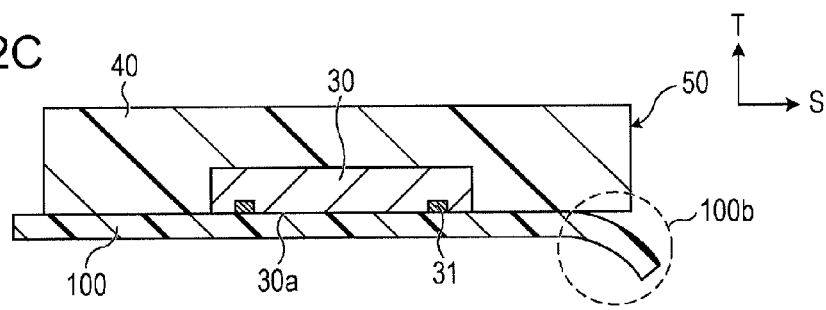
Figure 2D:
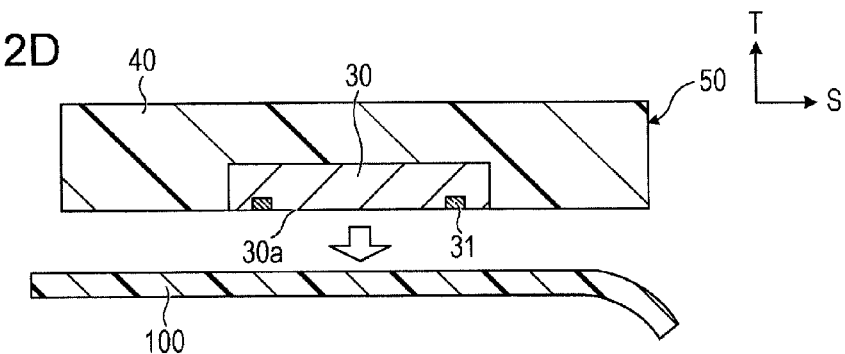

FIGS. 1A to 1C and 2A to 2D illustrate an example of a method of manufacturing a semiconductor device. FIG. 1A is a schematic cross-sectional view of the relevant part illustrating an example of providing an adhesive layer and a film. FIG. 1B is a schematic cross-sectional view of the relevant part illustrating an example of arranging a semiconductor element. FIG. 1C is a schematic cross-sectional view of the relevant part illustrating an example of providing the resin layer (forming a pseudo wafer). FIGS. 2A and 2B are schematic cross-sectional views of the relevant part illustrating an example of simultaneously separating the pseudo wafer and the film. FIGS. 2C and 2D are schematic cross-sectional views of the relevant part illustrating an example of separating the film.

When manufacturing a semiconductor device, first, as illustrated in FIG. 1A, an adhesive layer 20 is provided on a support member 10, and a film (adhesive film) 100 is provided on the adhesive layer 20. The support member 10 may be made of a semiconductor (e.g., silicon) substrate, a glass substrate, a metal (e.g., stainless steel) substrate, a ceramic substrate, or the like. The adhesive layer 20 and the film 100 may be made of an adhesive resin, such as epoxy resin, acrylic resin, polyimide resin, silicone resin, or urethane resin. The film 100 is made of an adhesive and flexible material. Furthermore, the film 100 has a different shape from the underlying adhesive layer 20 (herein, an example in which the size of the film 100 in plan view is smaller than the size of the adhesive layer 20 in plan view is illustrated). Details of the adhesive layer 20 and the film 100 will be described below.

After the adhesive layer 20 and the film 100 are provided on the support member 10, a semiconductor element 30, which serves as an electronic component, is arranged on the film 100, as illustrated in FIG. 1B. The semiconductor element 30 is attached to the film 100 such that a surface (electrode surface) 30a provided with electrodes 31 faces the film 100. The semiconductor element 30 may be a bare chip, for example, a large-scale integrated circuit (LSI) composed of a semiconductor material, such as silicon or gallium arsenide. The semiconductor element 30 may be arranged on the film 100 using a flip-chip bonder, a mounter, or the like.

FIG. 1B illustrates only one semiconductor element 30, though the semiconductor element 30 arranged on the film 100 may be more than one. A plurality of semiconductor elements 30 may be arranged at predetermined positions on a single film 100 such that the electrode surfaces 30a face the adhesive layer 20, similarly to the configuration illustrated in FIG. 1B.

After the semiconductor element 30 is arranged on the film 100, a resin layer 40 is provided on the film 100, as illustrated in FIG. 1C. The resin layer 40 may be made of any non-conducting sealing resin material used to seal the semiconductor element 30. The resin layer 40 may contain non-conducting filler, such as alumina, silica, aluminum hydroxide, or aluminum nitride, or inorganic filler that contains at least one of them. The resin layer 40 is provided on the film 100 by, for example, molding. Alternatively, the resin layer 40 may be provided on the film 100 by filling a frame surrounding the semiconductor element 30 on the film 100 with resin. The resin layer 40 provided on the film 100 is cured by heating or ultraviolet irradiation. In this way, the resin layer 40 is provided on the film 100, and a pseudo wafer (substrate) 50, in which the semiconductor element 30 is sealed with the resin layer 40, is formed on the film 100.

The resin layer 40 does not have to be completely cured at this stage. As will be described below, it is sufficient that the resin layer 40 is cured to such an extent that the pseudo wafer 50 after being separated from the adhesive layer 20 and the film 100 can be handled while being kept in a wafer state.

The curing conditions (temperature conditions, ultraviolet irradiation conditions, etc.) of the resin layer 40 at this stage are determined according to the materials of the resin layer 40, the adhesive layer 20, and the film 100, such that the adhesion of the adhesive layer 20 and the film 100 is maintained. Alternatively, the materials of the adhesive layer 20 and the film 100 are determined according to the material and the curing conditions of the resin layer 40.

The pseudo wafer 50 is formed to have a smaller size in plan view than the film 100. Alternatively, the film 100 having a larger size in plan view than the pseudo wafer 50 is preliminarily formed on the adhesive layer 20. The film 100 has such shape and size that at least a portion thereof extends beyond the pseudo wafer 50 in plan view.

Next, as illustrated in FIGS. 2A and 2B, the film 100 and the pseudo wafer 50 formed on the film 100 are simultaneously separated from the adhesive layer 20. When the film 100 and the pseudo wafer 50 are simultaneously separated from the adhesive layer 20, first, as illustrated in FIG. 2A, an edge 100a of the film 100 where the pseudo wafer 50 is not formed is separated from the adhesive layer 20. Then, as illustrated in FIG. 2B, the film 100, together with the pseudo wafer 50, is separated from the adhesive layer 20 from the previously separated edge 100a. In this manner, the pseudo wafer 50 and the film 100 are simultaneously separated from the adhesive layer 20 and the support member 10.

When simultaneously separating the pseudo wafer 50 and the film 100 from the adhesive layer 20, treatment to reduce the adhesion of the adhesive layer 20, such as ultraviolet irradiation, chemical treatment, or heating treatment may be omitted. Without the treatment to reduce the adhesion of the adhesive layer 20, the pseudo wafer 50 and the film 100 may be simultaneously and easily separated from the adhesive layer 20 by using a method in which the film 100 is separated from the adhesive layer 20 from the edge 100a, as illustrated in FIGS. 2A and 2B.

After the pseudo wafer 50 and the film 100 are simultaneously separated from the adhesive layer 20, the film 100 is separated from the pseudo wafer 50, as illustrated in FIGS. 2C and 2D. When the film 100 is separated from the pseudo wafer 50, first, an edge 100b of the film 100 where the pseudo wafer 50 is not formed is separated from the pseudo wafer 50, as illustrated in FIG. 2C. Then, the entire film 100 is separated from the pseudo wafer 50 from the previously separated edge 100b, as illustrated in FIG. 2D. By going through this process, the pseudo wafer 50 separated from the support member 10, the adhesive layer 20, and the film 100 is obtained.

When separating the film 100 from the pseudo wafer 50, treatment to reduce the adhesion of the film 100, such as ultraviolet irradiation, chemical treatment, or heating treatment may be omitted. Without the treatment to reduce the adhesion of the film 100, the film 100 may be easily separated from the pseudo wafer 50 by using a method in which the film 100 is separated from the pseudo wafer 50 from the edge 100b, as illustrated in FIGS. 2C and 2D.

The pseudo wafer 50 separated from the film 100 may be subjected to heating or ultraviolet irradiation to further cure the resin layer 40. A wiring layer (re-wiring layer) including conductive parts (vias, wires, or the like) that are to be electrically connected to the electrodes 31 of the semiconductor element 30 is formed on the surface of the thus-formed pseudo wafer 50 separated from the film 100, i.e., the surface where the electrode surface 30a of the semiconductor element 30 is exposed. After the wiring layer is formed, the resin layer 40 and the wiring layer are cut at a position around the semiconductor element 30, and thus, individual semiconductor devices (semiconductor packages) each including the semiconductor element 30 are formed.

Figure 3A:
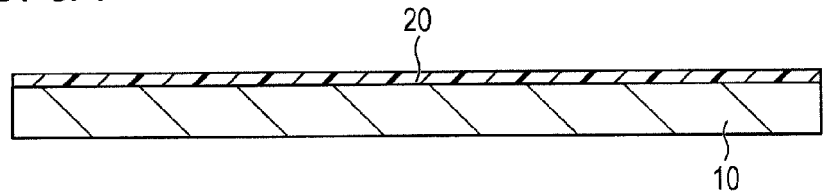
FIGS. 3A to 3D illustrate another method of manufacturing a semiconductor device.
Figure 3B:
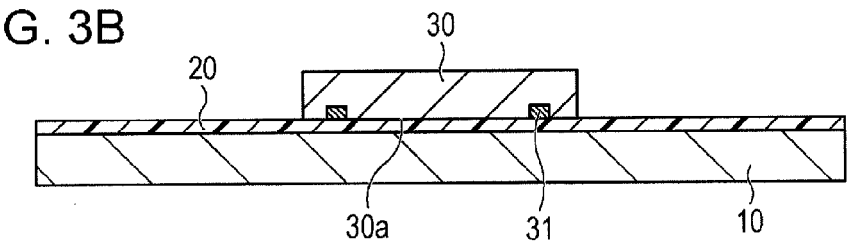
Figure 3C:
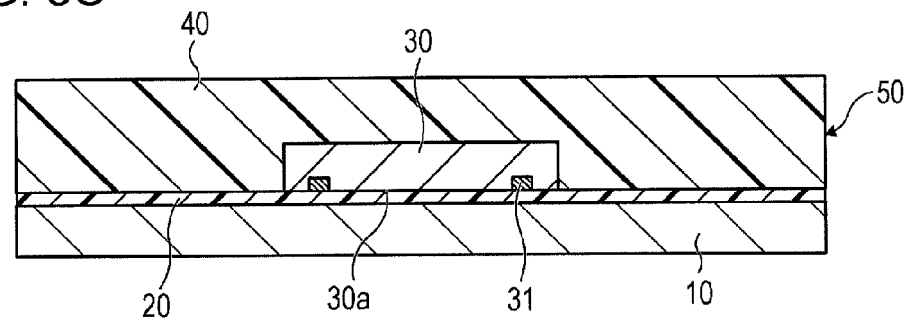
Figure 3D:
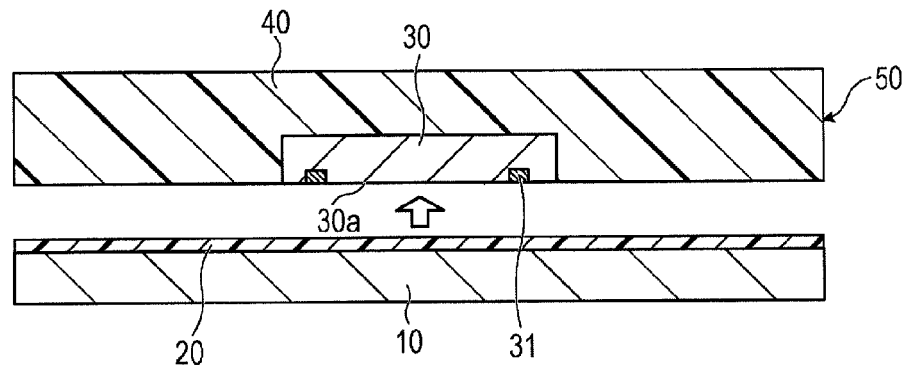

Now, another method of manufacturing a semiconductor device will be described for comparison. FIGS. 3A to 3C illustrate another method of manufacturing a semiconductor device. FIG. 3A is a schematic cross-sectional view of the relevant part illustrating an example of providing an adhesive layer. FIG. 3B is a schematic cross-sectional view of the relevant part illustrating an example of arranging a semiconductor element. FIG. 3C is a schematic cross-sectional view of the relevant part illustrating an example of providing a resin layer (forming a pseudo wafer). FIG. 3D is a schematic cross-sectional view of the relevant part illustrating an example of separating the pseudo wafer.

In this method, first, as illustrated in FIG. 3A, the adhesive layer 20 is provided on the support member 10. Next, as illustrated in FIG. 3B, the semiconductor element 30 is arranged on the adhesive layer 20 such that the electrode surface 30a thereof faces the adhesive layer 20. Then, as illustrated in FIG. 3C, the resin layer 40 is provided on the adhesive layer 20 on which the semiconductor element 30 is arranged. By curing the resin layer 40, the pseudo wafer 50 is formed on the adhesive layer 20. Then, as illustrated in FIG. 3D, the pseudo wafer 50 is separated from the adhesive layer 20. The wiring layer is formed on a surface of the pseudo wafer 50 separated from the adhesive layer 20, and the pseudo wafer 50 is diced into individual semiconductor devices (semiconductor packages).

In the process illustrated in FIG. 3D in this method, when the pseudo wafer 50 is to be separated from the adhesive layer 20, the adhesive layer 20 is subjected to, for example, ultraviolet irradiation treatment, chemical treatment, heating treatment, or the like to reduce the adhesion of the adhesive layer 20, and then, the pseudo wafer 50 is separated from the adhesive layer 20. In this case, it is difficult to reuse the adhesive layer 20 that has been subjected to ultraviolet irradiation, chemical treatment, heating treatment, or the like to reduce the adhesion. Hence, in this method, the used adhesive layer 20, which has reduced adhesion, is discarded, and a new adhesive layer 20 is used every time the pseudo wafer 50 is formed. Performing the treatment to reduce the adhesion of the adhesive layer 20 and the resulting inability to reuse the adhesive layer 20 lead to increases in man-hours and cost for manufacturing the pseudo wafer 50, and to an increase in cost of semiconductor packages produced from the pseudo wafer 50.

It is also possible that an adhesive layer 20 having low adhesion is preliminarily provided on the support member 10, and the pseudo wafer 50 formed on the adhesive layer 20 is separated by hand. However, even if such an adhesive layer 20 having relatively low adhesion is used, separating the pseudo wafer 50 from the adhesive layer 20 is not easy because the support member 10 and the pseudo wafer 50 including the cured resin layer 40 are both rigid and less likely to be deformed. Furthermore, if the adhesive layer 20 having low adhesion is used, the semiconductor element 30 provided thereon may be displaced due to pressure applied when the resin layer 40 is formed by molding or due to shrinkage of the resin layer 40 when curing. The displacement of the semiconductor element 30 may result in faulty electrical connection between the conductive parts and the semiconductor element 30 when forming the wiring layer in the subsequent process.

In contrast, when the film 100 is disposed between the pseudo wafer 50 and the adhesive layer 20, as in the method illustrated in FIGS. 1A to 1C, the pseudo wafer 50 and the film 100 may be simultaneously and easily separated from the adhesive layer 20, without reducing adhesion of the adhesive layer 20. Then, the film 100 is separated from the pseudo wafer 50 to obtain the separated pseudo wafer 50.

As has been described, the pseudo wafer 50 may be separated from the adhesive layer 20 using the film 100, without performing the treatment to reduce the adhesion of the adhesive layer 20. Thus, it becomes possible to reuse the adhesive layer 20. More specifically, as illustrated in FIGS. 1A to 1C, first, the semiconductor element 30 is arranged on the adhesive layer 20 on the support member 10 with the film 100 therebetween, and the resin layer 40 is provided thereon to form a first pseudo wafer 50. Then, as illustrated in FIGS. 2A and 2B, the pseudo wafer 50 is separated from the adhesive layer 20 simultaneously with the film 100. Then, another semiconductor element 30 is arranged, with the film 100 therebetween, on the adhesive layer 20 from which the pseudo wafer 50 and the film 100 have been separated, and anther resin layer 40 is provided thereon to form a second pseudo wafer 50. This second pseudo wafer 50 is separated from the adhesive layer 20 simultaneously with the film 100. The adhesive layer 20 from which the second pseudo wafer 50 and the film 100 have been separated may further be used to form a third pseudo wafer 50.

By omitting the treatment to reduce the adhesion of the adhesive layer 20 to enable reuse of the adhesive layer 20, it becomes possible to reduce the man-hours to perform the treatment to reduce adhesion and the man-hours to replace the adhesive layer 20 provided on the support member 10 every time the pseudo wafer 50 is formed. In addition to such reductions in man-hours, cost reduction becomes possible. As a result, it is possible to reduce the costs of the pseudo wafer 50 and the semiconductor packages.

Moreover, the above-described method that uses the film 100 is advantageous for reuse of the adhesive layer 20 from the following standpoint. That is, the pseudo wafer 50 is formed on the adhesive layer 20 with the film 100 therebetween, and thus, the adhesive layer 20 is not in contact with the resin layer 40. Hence, when the adhesive layer 20 is to be reused, the adhesive layer 20 may be reused without going through cleaning after the pseudo wafer 50 and the film 100 are separated therefrom.

In addition, when the film 100 is separated from the pseudo wafer 50 after the film 100 and the pseudo wafer have been simultaneously separated from the adhesive layer 20, treatment to reduce the adhesion of the film 100 may be omitted. Accordingly, the film 100 may also be reused. By reusing the film 100, as well as the adhesive layer 20, cost reduction becomes possible.

The adhesive layer 20 and the film 100 used in the above-described method of manufacturing a semiconductor device will be described in detail below. First, the adhesive layer 20 provided on the support member 10 will be described.

The adhesive layer 20 may be composed of, for example, epoxy resin, acrylic resin, polyimide resin, silicone resin, urethane resin, or a material containing at least one of them. The adhesive layer 20 may be provided on the support member 10 by attaching an adhesive film composed of the aforementioned material to the support member 10. Alternatively, the adhesive layer 20 may be provided on the support member 10 by applying the aforementioned material to the support member 10 by spin coating, splay coating, or printing.

The adhesive layer 20 maintains its adhesion even after the resin layer 40 is molded thereon and heated to cure. Furthermore, the adhesive layer 20 has such adhesion in, for example, a plane direction thereof (direction S in FIGS. 2A to 2D) that the film 100 is kept attached thereto without being displaced until the film 100 (and the pseudo wafer 50) is separated therefrom. Moreover, the adhesive layer 20 has such adhesion in, for example, a direction in which the film 100 is separated (direction T in FIGS. 2A to 2D) that the film 100 is easily separated. For example, the adhesive layer 20 exhibits lower adhesion in the direction T, in which the film 100 is separated, than in the plane direction S, in which the film 100 is provided.

Figure 4A:
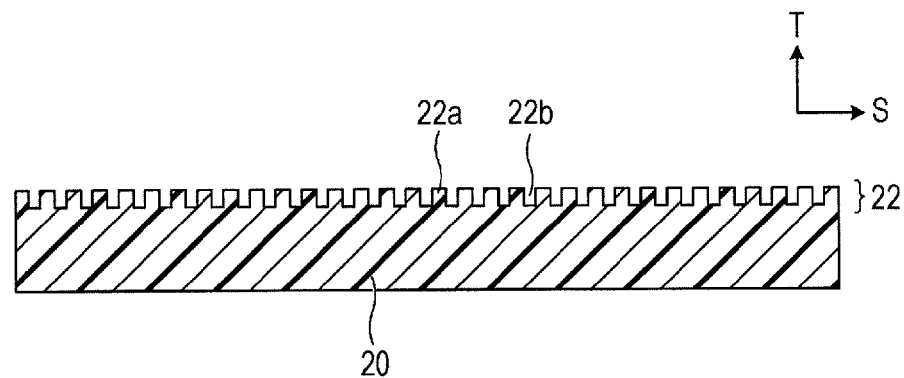
FIGS. 4A and 4B illustrate an example of the configuration of an adhesive layer.
Figure 4B:
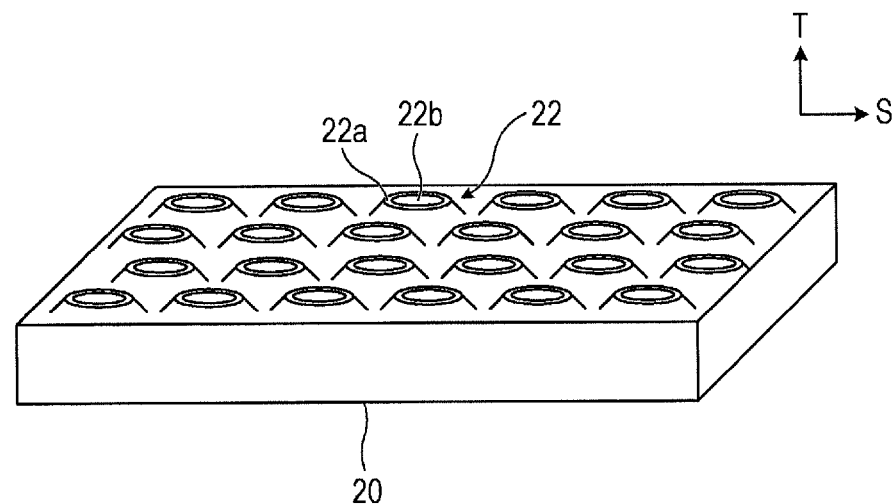

The adhesive layer 20 having the above-described properties is illustrated in FIGS. 4A and 4B. FIGS. 4A and 4B illustrate an example of the configuration of the adhesive layer. FIG. 4A is a schematic cross-sectional view of the relevant part illustrating an example of the adhesive layer, and FIG. 4B is a perspective schematic view of the relevant part illustrating an example of the adhesive layer.

The adhesive layer 20 has, for example, concave-convex portions 22 on a surface, i.e., a surface on which the film 100 is to be provided, as illustrated in FIG. 4A. Examples of the configuration of the concave-convex portions 22 include: convex portions 22a are arranged in a dot pattern, line-shaped convex portions 22a are arranged parallel to each other, and line-shaped parallel convex portions 22a are arranged orthogonal to one another, forming a grid pattern. Alternatively, as illustrated in FIG. 4B, crater-like concave-convex portions may be formed in which ring-like convex portions 22a surround concave portions 22b.

The adhesive layer 20 having the concave-convex portions 22 may be formed by imprinting, plasma treatment, dry etching treatment, wet etching treatment, or the like. Now, referring to FIGS. 5A, 5B, 6A, and 6B, a method of forming the adhesive layer 20 having the crater-like concave-convex portions 22, as illustrated in FIG. 4B, will be described.

Figure 5A:
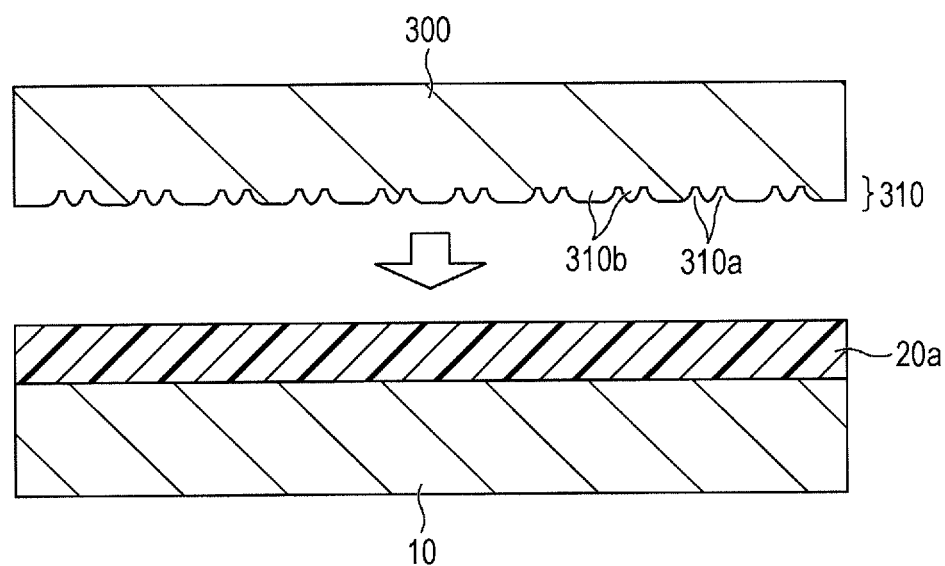
FIGS. 5A and 5B illustrate an example of a method of forming an adhesive layer (part 1)
Figure 5B:
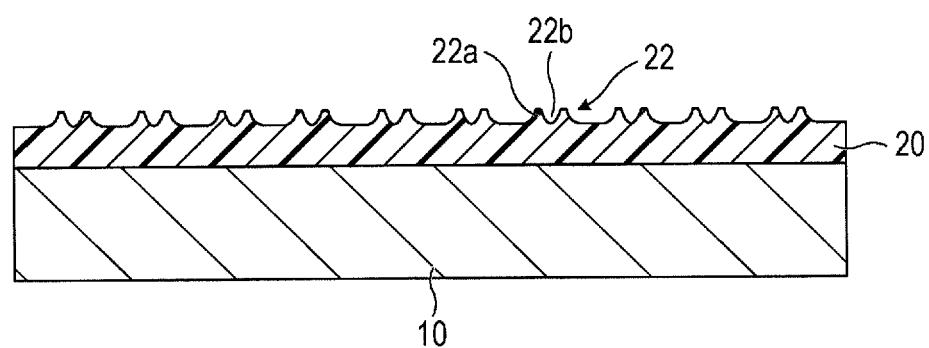

FIGS. 5A, 5B, 6A, and 6B illustrate a method of forming an adhesive layer. FIGS. 5A, 5B, 6A, and 6B are schematic cross-sectional views of the relevant part illustrating forming concave-convex portions of the adhesive layer. For example, when the crater-like concave-convex portions 22 of the adhesive layer 20 are to be formed by imprinting, as illustrated in FIG. 5A, a mold 300 having concave-convex portions 310 corresponding to the concave-convex portions 22 of the adhesive layer 20 is prepared. More specifically, the mold 300 that has concave portions 310a corresponding to the convex portions 22a of the adhesive layer 20 and convex portions 310b corresponding to the concave portions 22b of the adhesive layer 20 is prepared. Then, the mold 300 is pressed against a layer 20a, which is formed of an adhesive material used for the adhesive layer 20 and is provided on the support member 10. As a result, as illustrated in FIG. 5B, the adhesive layer 20 having the convex portions 22a and the concave portions 22b corresponding to the concave portions 310a and the convex portions 310b of the forming mold 300, respectively, is obtained.

Figure 6A:
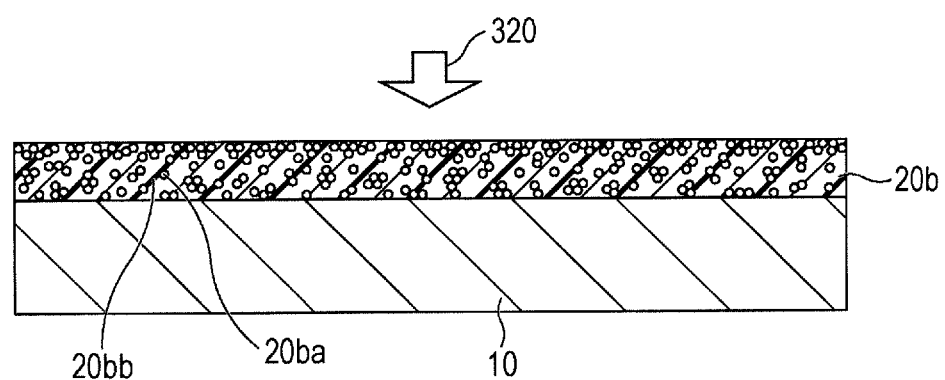
FIGS. 6A and 6B illustrate an example of a method of forming an adhesive layer (part 2)
Figure 6B:
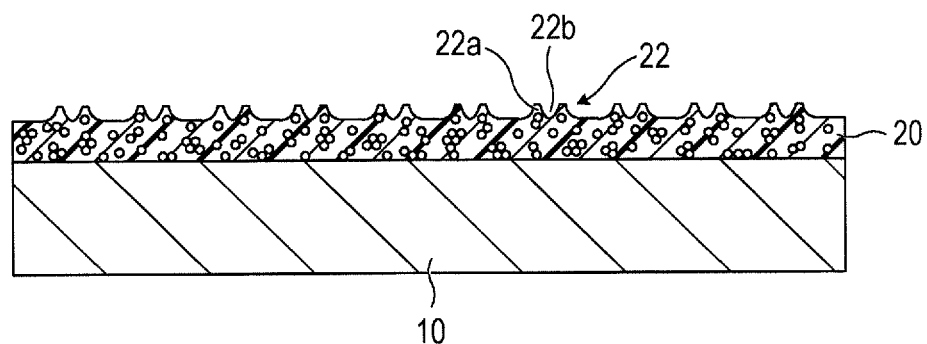

Another method of forming the crater-like concave-convex portions 22 of the adhesive layer 20, which uses plasma treatment, is illustrated in FIGS. 6A and 6B. In this method, for example, a mixture of acrylic resin filler 20ba and a matrix material 20bb containing adhesive epoxy resin or polyimide resin is provided on the support member 10, forming a layer 20b as illustrated in FIG. 6A. The surface of the layer 20b is then treated with, for example, oxygen plasma 320. At this time, the acrylic resin filler 20ba on the surface of the layer 20b is selectively removed because the etching rate of the acrylic resin filler 20ba is higher than that of the matrix material 20bb containing the epoxy resin or polyimide resin. As a result, as illustrated in FIG. 6B, the concave portions 22b are formed at portions where the acrylic resin filler 20ba is selectively removed, and thus, the adhesive layer 20 having the crater-like concave-convex portions 22 is obtained.

The acrylic resin filler 20ba having an average particle diameter of, for example, 100 nm to 500 nm may be used. By using the acrylic resin filler 20ba, the concave-convex portions 22, in which the diameter D of the convex portions 22a surrounding the concave portions 22b, which are recessed like craters, is in the range of 0.1 μm to 10 μm, and the height H of the convex portions 22a is in the range of 0.2 nm to 1000 nm may be formed.

Note that the combination of materials that may be used to form the adhesive layer 20 by the method illustrated in FIGS. 6A and 6B is not limited to the above-described example. Furthermore, although a case where the concave-convex portions 22 are formed by plasma treatment has been described herein, the concave-convex portions 22 may alternatively be formed by selective etching achieved by dry etching treatment or wet etching treatment.

The above-described adhesive layer 20 has an adhesion of 400 N/cm or less in the direction T, in which the film 100 is separated, and an adhesion of 10 N/cm$^2$ or more in the plane direction S, in which the film 100 is provided (a silicon chip having dimensions of 5 mm by 5 mm and a thickness of 0.5 mm is placed on the adhesive layer 20, and the adhesion in the plane direction S is measured using a die shear tester).

The use of the adhesive layer 20 having the concave-convex portions 22 makes it possible to suppress displacement, in the direction S, of the film 100 (and pseudo wafer 50) provided thereon and to simultaneously and easily separate the film 100 and the pseudo wafer 50 formed thereon.

Figure 7A:
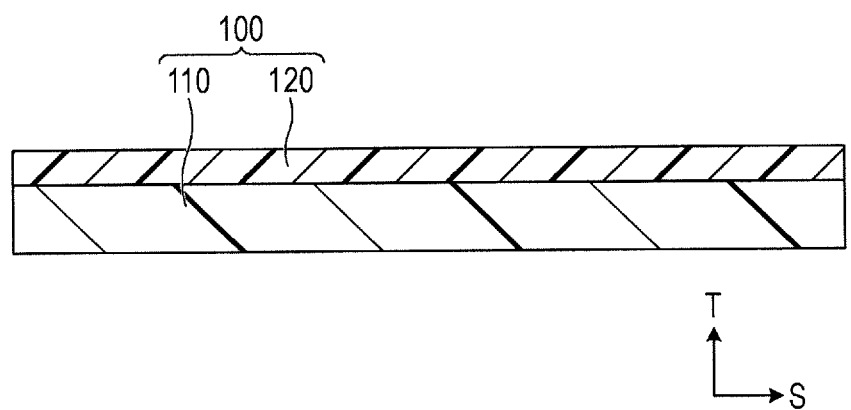
FIGS. 7A and 7B illustrate an example of the configuration of a film.
Figure 7B:
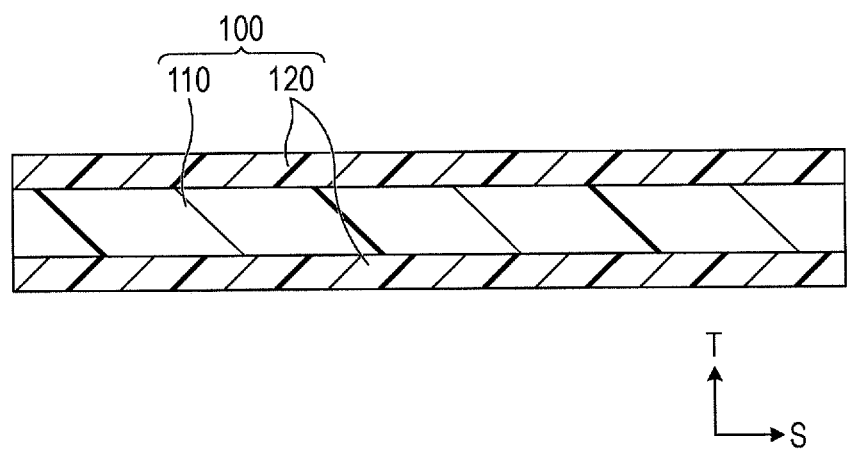

Next, the film 100 provided on the adhesive layer 20 will be described. FIGS. 7A and 7B illustrate an example of the configuration of the film. FIGS. 7A and 7B are schematic cross-sectional views of the relevant part illustrating an example of the film.

The film 100 may include, for example, a base member (base layer) 110 and adhesive (adhesive layer) 120 provided on one surface of the base member, as illustrated in FIG. 7A. The film 100 including the base member 110 and the adhesive 120 provided on one surface thereof, as illustrated in FIG. 7A, is disposed on the adhesive layer 20 of the support member 10 (FIG. 1A) such that the base member 110 faces the adhesive layer 20 and such that the adhesive 120 faces up (direction T). The semiconductor element 30 and the resin layer 40 are provided on the adhesive 120 of the film 100, thus forming the pseudo wafer 50 (FIGS. 1B and 1C).

The base member 110 may be composed of a heat-resistant resin material, such as polyimide resin, silicone resin, or fluorocarbon resin. The adhesive 120 may be composed of, for example, epoxy resin, acrylic resin, polyimide resin, silicone resin, urethane resin, or a material that contains at least one of them.

The adhesive 120 is capable of suppressing displacement of the semiconductor element 30 provided thereon in the direction S and keeping the semiconductor element 30 attached thereto until the film 100 is separated from the pseudo wafer 50. For example, when the resin layer 40 provided so as to seal the semiconductor element 30 is cured when forming the pseudo wafer 50 on the film 100, the resin layer 40 may shrink. Displacement of the semiconductor element 30 in the direction S due to curing shrinkage of the resin layer 40 may cause faulty electrical connection between the wires or the via and the semiconductor element 30 when the wiring layer is formed on the pseudo wafer 50 in the subsequent process. By providing the adhesive 120 that is capable of suppressing the displacement of the semiconductor element 30 in the direction S and keeping the semiconductor element 30 attached thereto on the film 100, the wiring layer may be precisely formed under certain conditions in the subsequent process, even when the curing shrinkage of the resin layer 40 occurs.

As illustrated in FIG. 7B, the adhesive 120 may be provided on both sides of the base member 110. The film 100 that includes the base member 110 and the adhesive 120 provided on both sides thereof is provided such that the adhesive 120 on one side faces the adhesive layer 20 on the support member 10 and such that the adhesive 120 on the other side faces up (direction T) (FIG. 1A). The semiconductor element 30 and the resin layer 40 are provided on the upper adhesive 120 of the film 100, thus forming the pseudo wafer 50 (FIGS. 1B and 1C).

The compositions and thicknesses of the base member 110 and the adhesive 120 are determined such that the film 100 is flexible, when they are stacked into the film 100, as illustrated in FIGS. 7A and 7B. It is preferable that the composition and thickness of the film 100 be determined such that the film 100 is flexible and is strong enough to be able to be separated from the adhesive layer 20 and the pseudo wafer 50 without being broken. The thickness of the film 100 is, for example, 10 μm or more.

The concave-convex portions 22 similar to those provided on the adhesive layer 20 may be provided on the adhesive 120 provided on the surface of the film 100 on which the pseudo wafer 50 is formed. In the foregoing description, the semiconductor element 30 has been presented as an example of an electronic component provided on the film 100. Other than the semiconductor element 30, another electronic component, such as a chip capacitor, may be provided on the film 100. Examples of a method of manufacturing semiconductor devices each including the semiconductor element 30 and another electronic component (chip component), such as a chip capacitor, will be described with reference to FIGS. 8 to 17.

Figure 9:
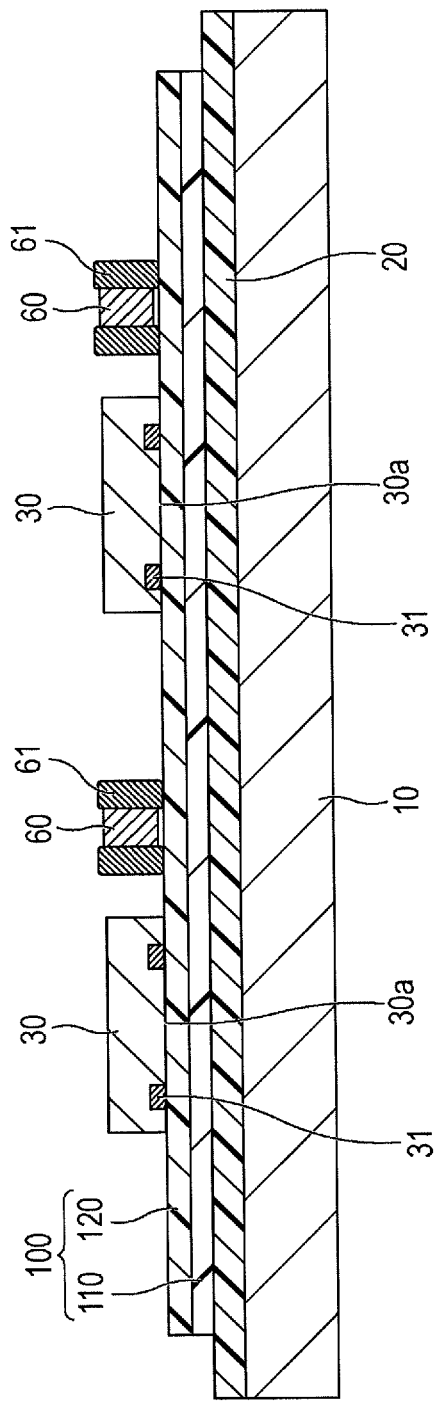
FIG. 9 illustrates an example of a manufacturing process of a semiconductor device (part 2)
Figure 10:
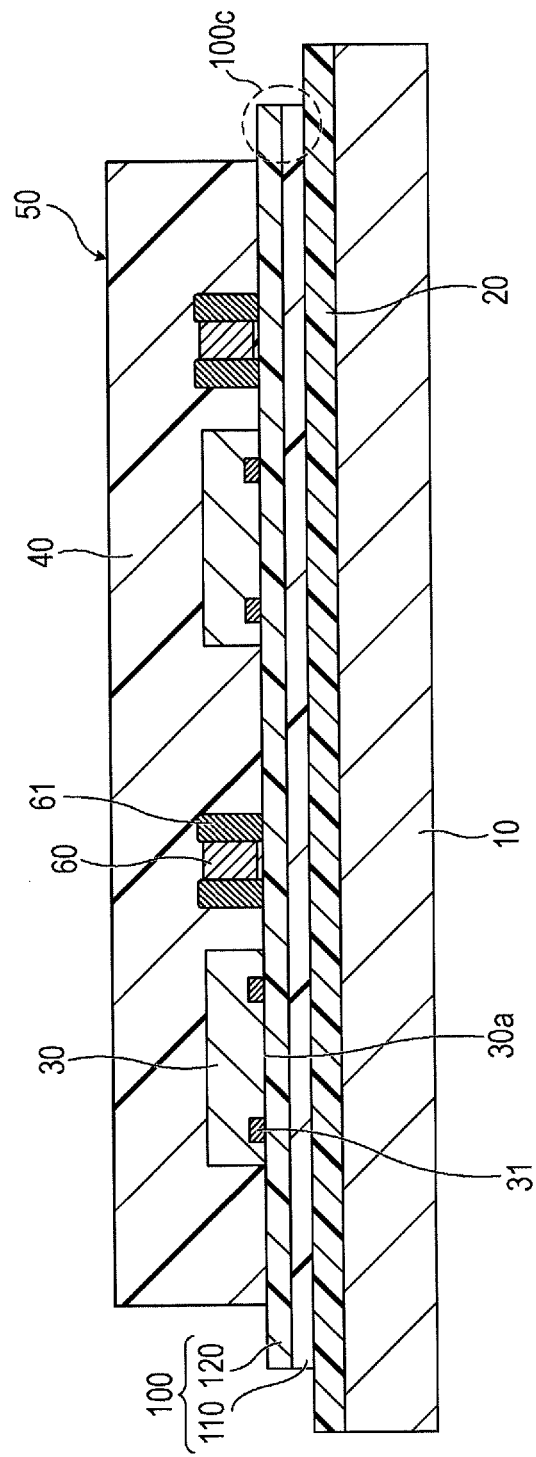
FIG. 10 illustrates an example of a manufacturing process of a semiconductor device (part 3)
Figure 11:
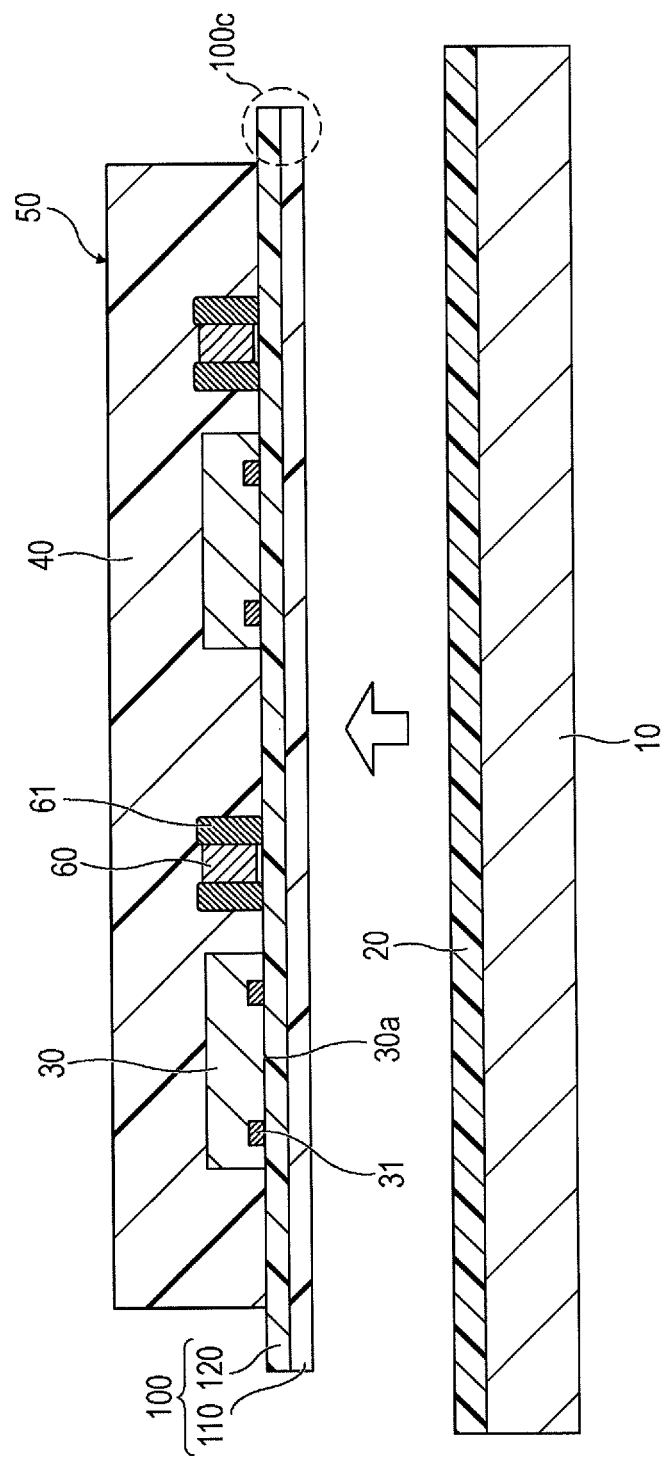
FIG. 11 illustrates an example of a manufacturing process of a semiconductor device (part 4)
Figure 12:
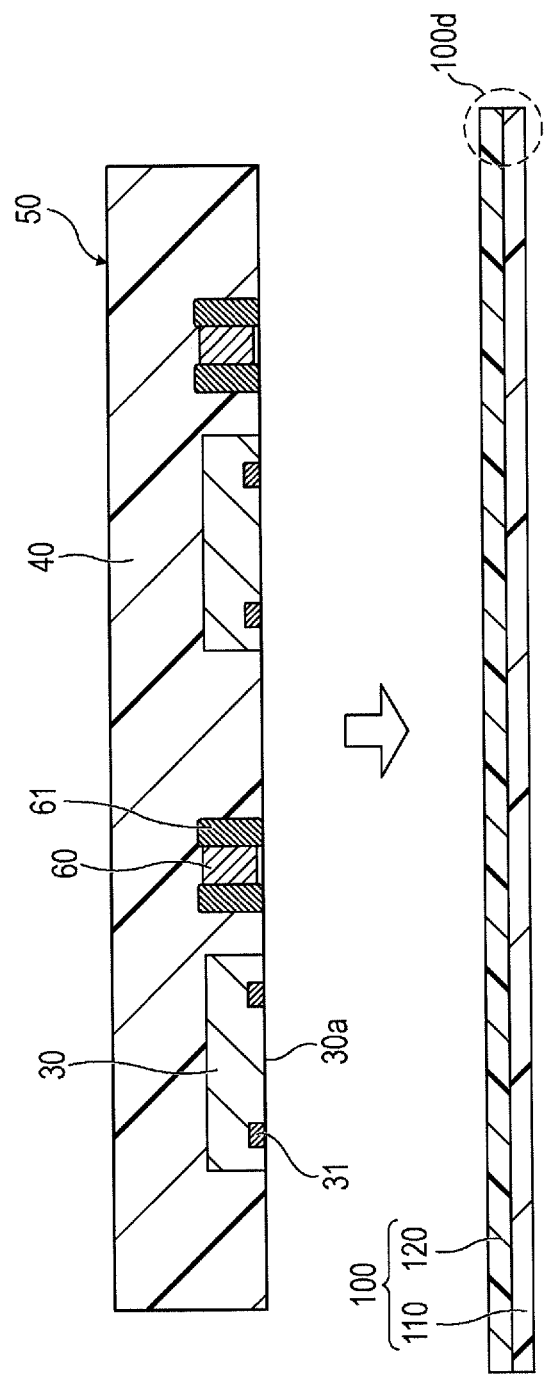
FIG. 12 illustrates an example of a manufacturing process of a semiconductor device (part 5)
Figure 13:
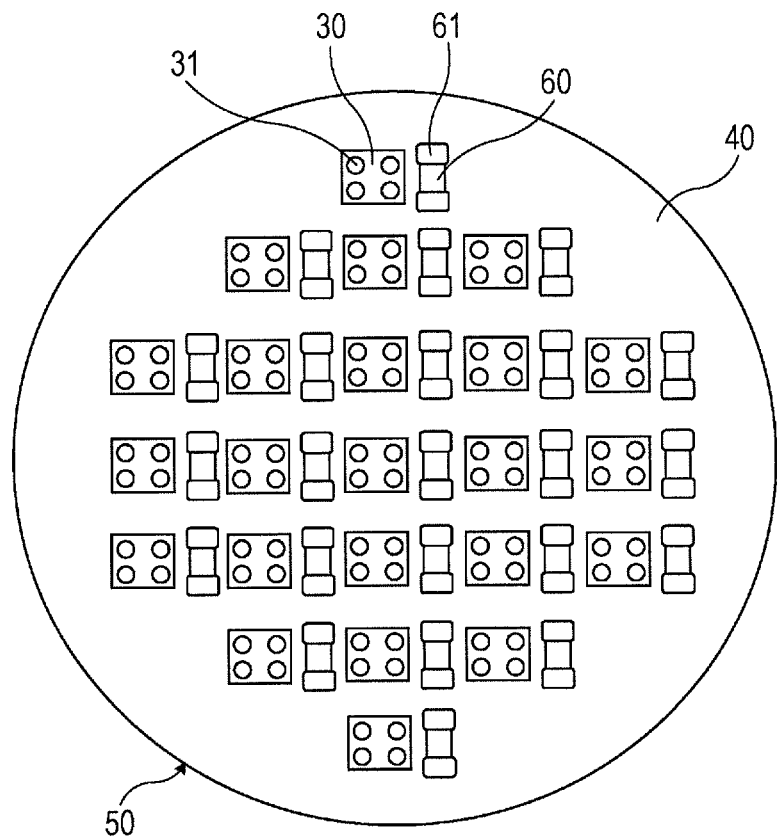
FIG. 13 illustrates an example of a manufacturing process of a semiconductor device (part 6)
Figure 14:
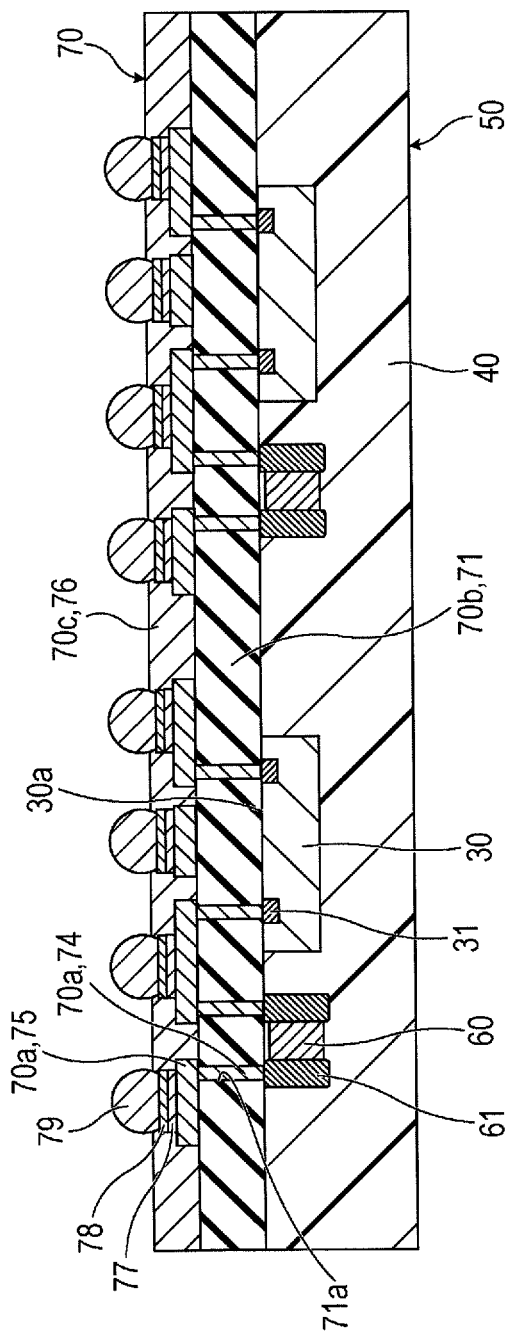
FIG. 14 illustrates an example of a manufacturing process of a semiconductor device (part 7)
Figure 15:
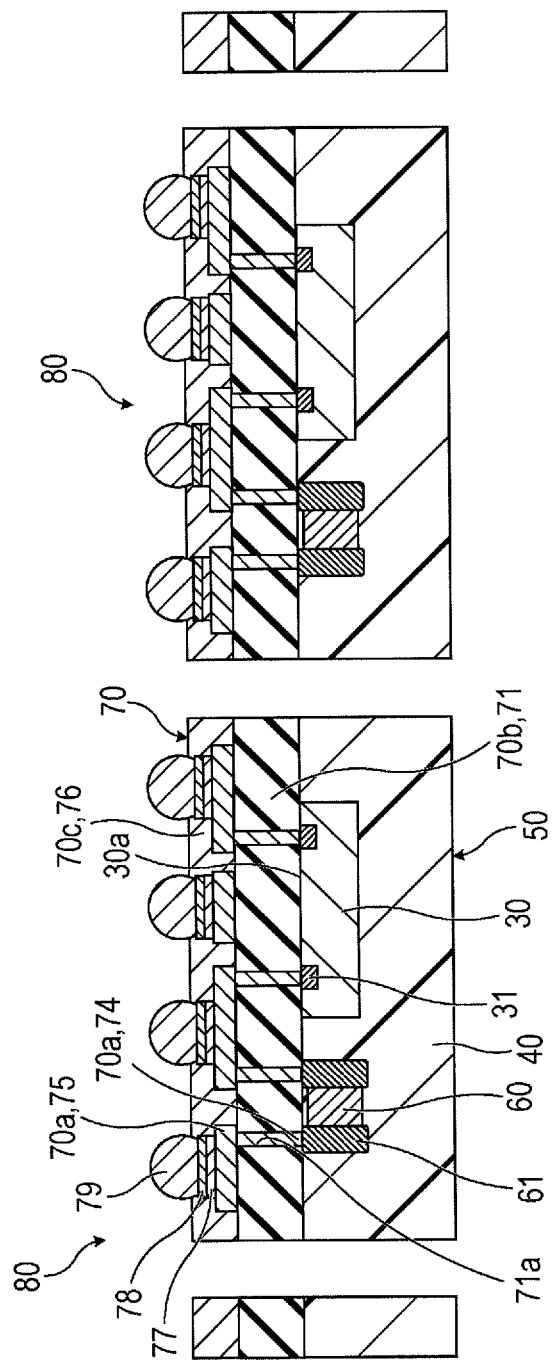
FIG. 15 illustrates an example of a manufacturing process of a semiconductor device (part 8)

FIGS. 8 to 17 illustrate an example of a manufacturing process of semiconductor devices. FIG. 8 is a schematic cross-sectional view of the relevant part illustrating an example of providing an adhesive layer and a film. FIG. 9 is a schematic cross-sectional view of the relevant part illustrating an example of arranging electronic components. FIG. 10 is a schematic cross-sectional view of the relevant part illustrating an example of providing a resin layer (forming a pseudo wafer). FIG. 11 is a schematic cross-sectional view of the relevant part illustrating an example of simultaneously separating the pseudo wafer and the film. FIG. 12 is a schematic cross-sectional view of the relevant part illustrating an example of separating the film. FIG. 13 is a schematic plan view of the pseudo wafer, as viewed from a side from which the film is separated. FIG. 14 is a schematic cross-sectional view of the relevant part illustrating an example of forming a wiring layer. FIG. 15 is a schematic cross-sectional view of the relevant part illustrating an example of obtaining individual semiconductor devices. FIGS. 16 and 17 illustrate forming a wiring layer.

First, as illustrated in FIG. 8, the adhesive layer 20 is provided on the flat support member 10. For example, the adhesive layer 20 as illustrated in FIGS. 4A and 4B, which has adhesion as described above with respect to the directions S and T (i.e., the adhesion in the direction T is lower than the adhesion in the direction S), is provided.

As illustrated in FIG. 8, the film 100 is provided on the adhesive layer 20. For example, the film 100 including the base member 110 and the adhesive 120 provided on one surface thereof, as illustrated in FIG. 7A, is provided. The film 100 has a different shape (size in plan view) from the adhesive layer 20. By providing the film 100 having a different size in plan view from the adhesive layer 20, the film 100 and the pseudo wafer 50 may be easily separated from the adhesive layer 20. The size of the film 100 in plan view may be either larger or smaller than the size of the adhesive layer 20 in plan view. FIG. 8 illustrates a case where the size of the film 100 in plan view is smaller than the size of the adhesive layer 20 in plan view.

Next, as illustrated in FIG. 9, the semiconductor elements 30 and chip components 60, such as chip capacitors, are arranged at predetermined regions of the film 100 (adhesive 120). The electrodes 31 at the electrode surfaces 30a of the semiconductor elements 30 are attached to the adhesive 120 of the film 100, and electrodes 61 of the chip components 60 are attached to the adhesive 120 of the film 100. For example, the semiconductor elements 30 and the chip components 60 are arranged at predetermined regions of the film 100 using a flip-chip bonder and a mounter, respectively.

Next, as illustrated in FIG. 10, the resin layer 40 is provided on the film 100 on which the semiconductor elements 30 and the chip components 60 are provided, and the resin layer 40 is cured, forming the pseudo wafer 50. At this time, the resin layer 40 is provided such that the size of the pseudo wafer 50 in plan view is smaller than the size of the film 100 in plan view (such that an edge 100c of the film 100 extends beyond the pseudo wafer 50). With this configuration, the film 100 may be easily separated from the pseudo wafer 50, as will be described below.

Next, as illustrated in FIG. 11, the film 100 is separated from the adhesive layer 20 simultaneously with the pseudo wafer 50. At this time, first, the edge 100c (i.e., an edge where the pseudo wafer 50 is not formed) of the film 100 having a different size in plan view from the adhesive layer 20 is separated from the adhesive layer 20, and the entire film 100 is separated from the adhesive layer 20 simultaneously with the pseudo wafer 50 from the edge 100c. Although the support member 10 below the adhesive layer 20 and the pseudo wafer 50 above the film 100 have certain rigidity, by using the film 100 disposed therebetween in this manner, the pseudo wafer 50 may be easily separated from the adhesive layer 20 and the support member 10.

Next, as illustrated in FIG. 12, the film 100 is separated from the pseudo wafer 50 after the pseudo wafer 50 and the film 100 have been simultaneously separated from the adhesive layer 20. At this time, the entire film 100 is separated from the pseudo wafer 50 from an edge 100d of the film 100 (i.e., an edge where the pseudo wafer 50 is not formed). By making the film 100 from a flexible material having certain strength and by making a part thereof protrude from the pseudo wafer 50, the film 100 may be smoothly and easily separated from the pseudo wafer 50.

After the film 100 is separated from the pseudo wafer 50, heating treatment, ultraviolet irradiation treatment, or the like is performed to further cure the resin layer 40 (complete curing). By going through the above-described process, the pseudo wafer 50 is obtained, in which the electrodes 31 of the semiconductor elements 30 and the electrodes 61 of the chip components 60 are exposed from the resin layer 40 on the surface from which the film 100 has been removed, as illustrated in FIGS. 12 and 13.

The wiring layer 70 as illustrated in FIG. 14 is formed on a surface, from which the electrodes 31 of the semiconductor elements 30 and the electrodes 61 of the chip components 60 are exposed, of the pseudo wafer 50 separated from the support member 10, the adhesive layer 20, and the film 100. The wiring layer 70 includes conductive parts 70a, such as vias and wires, which are to be electrically connected to the electrodes 31 of the semiconductor elements 30 and the electrodes 61 of the chip components 60, and insulating parts 70b provided around the conductive parts 70a. Furthermore, the wiring layer 70 has a protection film 70c, which is composed of solder resist or the like, on the surface thereof.

This wiring layer 70 may be formed by going through the process illustrated in, for example, FIGS. 16 and 17. For convenience's sake, herein, a method of forming the wiring layer 70 will be described, taking a pair of the semiconductor element 30 and the chip component 60 in the pseudo wafer 50 as an example.

Figure 16A:
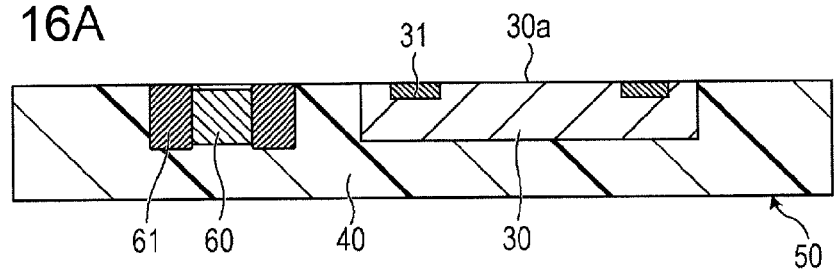
FIGS. 16A to 16D illustrate an example of a manufacturing process of a semiconductor device (part 9)
Figure 16B:
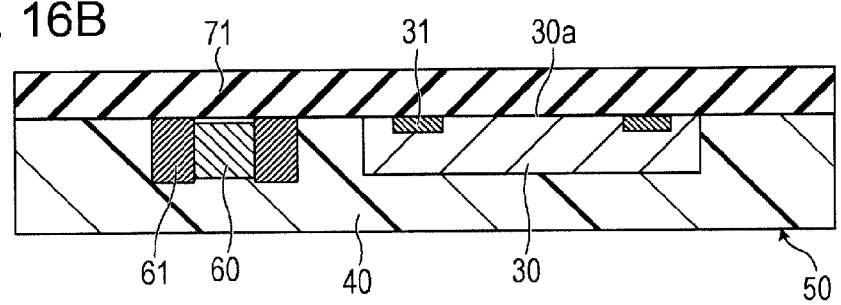
Figure 16C:
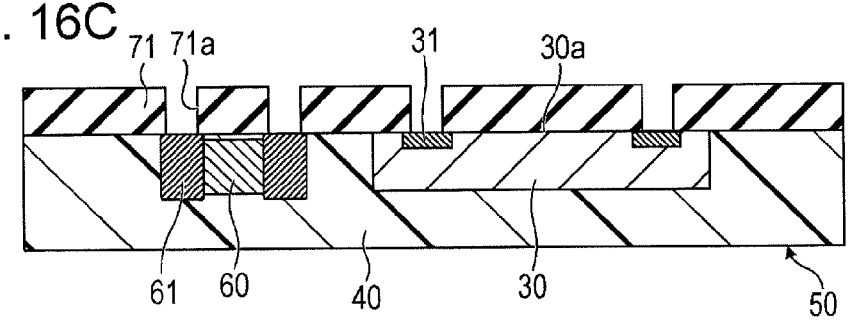
Figure 16D:
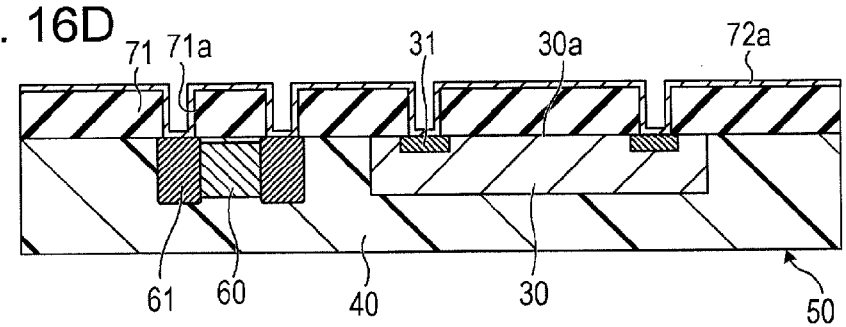

First, as illustrated in FIG. 16B, photosensitive resin 71 (70b), such as photosensitive epoxy, is applied to the pseudo wafer 50 from which the film 100 has been separated, as illustrated in FIG. 16A. The photosensitive resin 71 is applied to a surface of the pseudo wafer 50 from which the film 100 has been separated, i.e., a surface from which the electrodes 31 of the semiconductor element 30 and the electrodes 61 of the chip component 60 are exposed. Next, as illustrated in FIG. 16C, exposure, development, and curing are performed to provide openings 71a communicating with the electrodes 31 of the semiconductor element 30 and the electrodes 61 of the chip component 60. Plasma treatment may be performed after providing the openings 71a. Next, a metal contact layer composed of, for example, titanium or chrome and a copper layer are formed by sputtering, thereby forming a seed layer 72a, as illustrated in FIG. 16D.

Figure 17A:
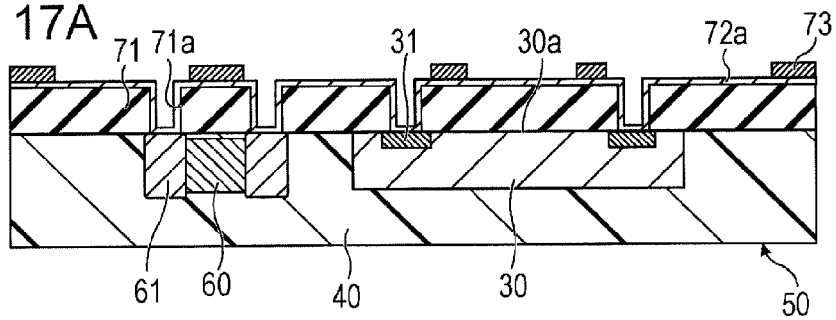
FIGS. 17A to 17D illustrate an example of a manufacturing process of a semiconductor device (part 10)
Figure 17B:
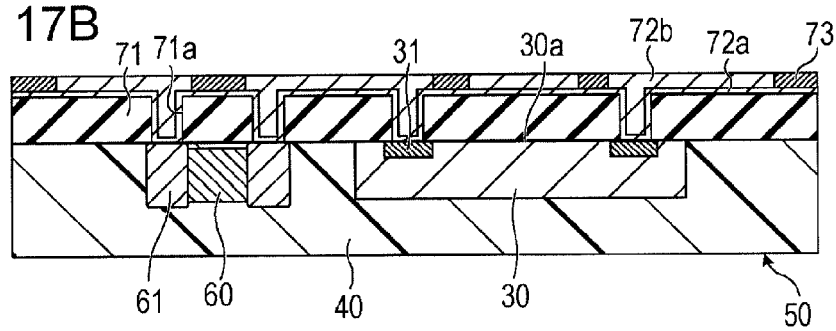
Figure 17C:
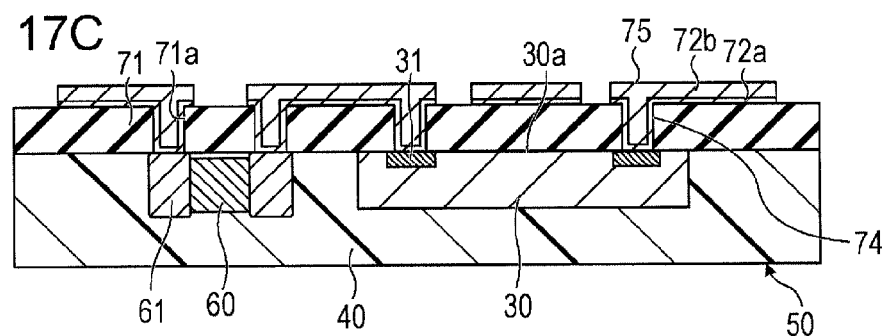

After forming the seed layer 72a, as illustrated in FIG. 17A, a photoresist layer 73 formed in a pattern in which regions where vias and wires are to be provided are open is formed. Next, as illustrated in FIG. 17B, copper electroplating is performed using the previously formed seed layer 72a, thereby forming a plating layer 72b. Then, as illustrated in FIG. 17C, the photoresist layer 73 is removed, and the seed layer 72a remaining in the regions where the photoresist layer 73 was formed is removed by etching. Thus, vias 74 and wires 75 (70a) connected to the electrodes 31 of the semiconductor element 30 and the electrodes 61 of the chip component 60, as illustrated in FIG. 17C, are formed. The wires 75 may be subjected to surface treatment to improve the contact characteristics.

When the thus-formed vias 74 and wires 75 are used as a first wiring layer and second and subsequent wiring layers are formed on the first wiring layer to form a multilayer wiring, the process illustrated in FIGS. 16A to 16D and 17A to 17C is repeated.

Figure 17D:
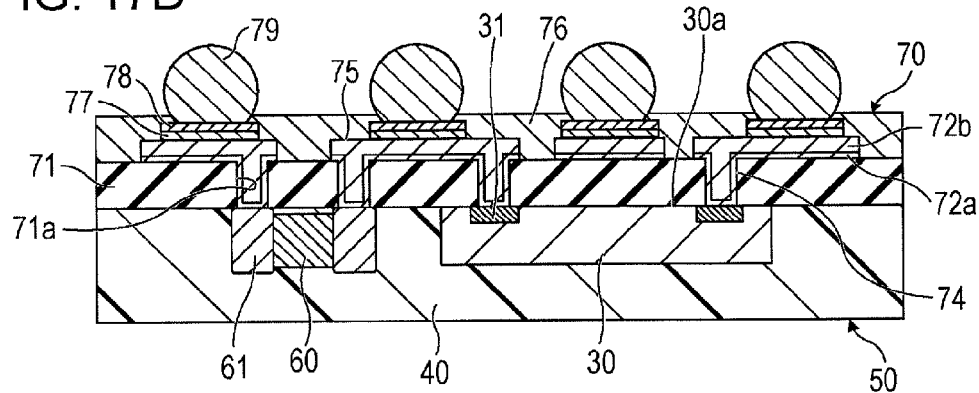

As illustrated in FIG. 17D, a solder resist layer 76 (70c) is formed on the wires 75 in the top layer such that portions of the wires 75 (external connection terminals) are exposed. Surface treatment using, for example, nickel and gold is performed on the regions of the wires 75 exposed from the solder resist layer 76 to form a nickel layer 77 and a gold layer 78. In the regions of the wires 75 serving as the external connection terminals (or on the surfaces after treatment when the nickel layer 77 and the gold layer 78 are formed), bumps 79, such as solder balls, are formed.

After the wiring layer 70 is formed as illustrated in FIGS. 16A to 16D and 17A to 17D, the pseudo wafer 50 and the wiring layer 70 are diced at predetermined positions, as illustrated in FIG. 15. Thus, individual semiconductor devices 80 each including the semiconductor element 30 and the chip component 60 are obtained.

In the method of manufacturing the semiconductor device 80, the film 100 is disposed between the pseudo wafer 50 and the support member 10 that is provided with the adhesive layer 20. After the pseudo wafer 50 is formed on the film 100, first, the film 100 and the pseudo wafer 50 are simultaneously separated from the adhesive layer 20, and then, the film 100 is separated from the pseudo wafer 50. Thus, the pseudo wafer 50 may be easily separated from the support member 10, adhesive layer 20, and the film 100.

At this time, treatment to reduce the adhesion of the adhesive layer 20 and the film 100, such as ultraviolet irradiation, chemical treatment, heating treatment, or the like may be omitted. Thus, the adhesive layer 20, as well as the film 100, may be reused. For example, the support member 10 and the adhesive layer 20 from which the pseudo wafer 50 and the film 100 have been separated in the process illustrated in FIG. 11 may be reused when a new pseudo wafer 50 is formed. The film 100 that has been separated from the pseudo wafer 50 in the process illustrated in FIG. 12 may also be reused when a new pseudo wafer 50 is formed.

According to the above-described method using the film 100, it is possible to reduce the man-hours and cost to manufacture the semiconductor device 80, and consequently, it is possible to reduce the cost of the semiconductor device 80.

Figure 18:
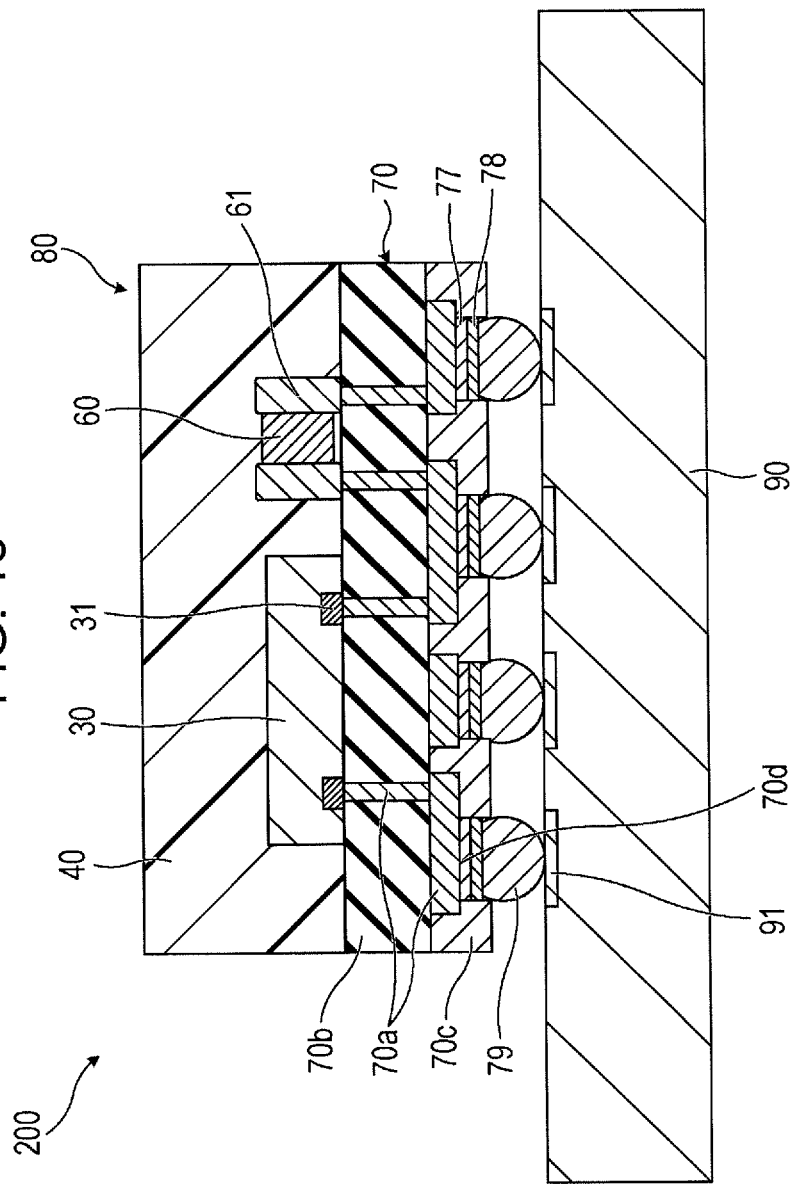
FIG. 18 illustrates an example of an electronic device.

The thus-obtained semiconductor device 80 may be mounted to a circuit board. FIG. 18 illustrates an example of an electronic device. FIG. 18 is a schematic cross-sectional view of the relevant part illustrating an example of the electronic device.

An electronic device 200 illustrated in FIG. 18 includes a semiconductor device 80 and a circuit board 90. The semiconductor device 80 has the nickel layer 77, the gold layer 78, and the bumps 79, i.e., solder balls, formed on external connection terminals 70d of the wiring layer 70. The semiconductor device 80 is mounted to the circuit board 90 in such a manner that it is electrically connected to electrode pads 91 of the circuit board 90 via the bumps 79.

The individual semiconductor device 80 may be mounted to the circuit board 90 and used in the electronic device 200. By using the semiconductor device 80 that is capable of being manufactured with reduced man-hour and costs, it is possible to realize the electronic device 200 at low cost.

Although the pseudo wafer 50 having a circular shape in plan view has been described in the foregoing description, the shape of the pseudo wafer 50 is not limited thereto. The pseudo wafer 50 may have, other than a circular shape, a rectangular shape in plan view. The pseudo wafer 50 having a circular shape in plan view may be formed by using semiconductor manufacturing equipment, and the pseudo wafer 50 having a rectangular shape in plan view may be formed by using printing wiring board manufacturing equipment.

EXAMPLE

Now, an example will be described below. An adhesive layer that is mainly composed of silicone resin and has a thickness of 50 μm was formed on a silicon wafer. Crater-like concave-convex portions, in which concave portions having a diameter of 2 μm are surrounded by convex portions having a height of 0.3 μm, were formed on the surface of the adhesive layer by nano-imprinting. A film (adhesive film) that has a thickness of 50 μm and is composed of a polyimide base member and a silicone adhesive formed on a surface of the base member was disposed on the adhesive layer. This film was disposed on the adhesive layer such that the base member faces the adhesive layer and such that the adhesive faces up.

A semiconductor element was arranged on the adhesive of the film using a flip-chip bonder such that an electrode surface faces the film. The semiconductor element on the film was sealed with a resin layer using a mold, and the resin layer was cured, thus forming a pseudo wafer. Then, first, the film and the pseudo wafer were simultaneously separated from the adhesive layer on the support member, and next, the film was separated from the pseudo wafer. The thus-obtained pseudo wafer was subjected to heating treatment at 200° C. for one hour, so that the resin layer was completely cured.

Next, photosensitive epoxy varnish was applied to a surface of the pseudo wafer 50 from which the film 100 had been separated (i.e., a surface where electrodes of the semiconductor element were exposed) by spin coating, and then, pre-baking, exposure, development, curing, and oxygen plasma treatment were performed. Thus, an insulating layer having a thickness of 8 µm and having openings with a diameter of 30 µm communicating with the electrodes of the semiconductor element was formed. Next, titanium and copper were sputtered to form a titanium layer having a thickness of 0.1 µm and a copper layer having a thickness of 0.3 µm, thereby forming seed layers. Then, a photoresist layer formed in a pattern in which regions where vias and wires are to be provided are open was formed, and copper electroplating was performed using the previously formed seed layers to form the vias and the wires. After the electroplating, the photoresist layer was separated, and portions of the seed layers covered by the photoresist layers were removed by wet etching treatment and dry etching treatment. Then, the wires were partially exposed, a solder resist layer was formed thereon, the surfaces of the exposed wires were treated with nickel and gold, and bumps were formed thereon. A substrate obtained by providing the wiring layer on the pseudo wafer in this manner was cut at predetermined positions to obtain individual semiconductor devices (semiconductor packages).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of manufacturing a semiconductor device comprising:
   providing a first adhesive layer on a support member;
   providing a film on the first adhesive layer;
   arranging a semiconductor element on the film;
   providing a resin layer on the film on which the semiconductor element is arranged, and forming a substrate including the semiconductor element and the resin layer on the film;
   separating the film and the substrate from the first adhesive layer; and
   separating the film from the substrate after the substrate and the film have been simultaneously separated from the first adhesive layer.

2. The method of manufacturing a semiconductor device according to claim 1,
   wherein the film includes a base layer and a second adhesive layer provided on at least one surface of the base layer,
   wherein the film is provided such that the second adhesive layer faces up in the providing the film on the first adhesive layer, and
   wherein the semiconductor element is arranged on the second adhesive layer facing up in the arranging the semiconductor element on the film.

3. The method of manufacturing a semiconductor device according to claim 1, further comprising, after separating the film from the substrate, providing a wiring layer on a surface of the substrate from which the film has been separated, the wiring layer including a conductive part to be electrically connected to the semiconductor element.

4. The method of manufacturing a semiconductor device according to claim 3, further comprising after, after providing the wiring layer, cutting the resin layer and the wiring layer at a position around the semiconductor element to obtain a semiconductor package that includes the semiconductor element, the resin layer, and the wiring layer.

5. The method of manufacturing a semiconductor device according to claim 1,
   wherein the first adhesive layer exhibits lower adhesion in a direction in which the film is separated than in a plane direction in which the film is provided.

6. The method of manufacturing a semiconductor device according to claim 5,
   wherein the first adhesive layer has a concave and a convex on the surface where the film is provided.

7. The method of manufacturing a semiconductor device according to claim 6,
   wherein the concave and convex include a crater-like concave-convex portion.

8. The method of manufacturing a semiconductor device according to claim 7,
   wherein, in forming the substrate, the substrate is formed such that a portion of the film extends beyond the formed substrate.

9. The method of manufacturing a semiconductor device according to claim 1,
   wherein, in the providing film, the film having a different shape from the first adhesive layer is provided.

10. A method of manufacturing a semiconductor device comprising:
    providing a first adhesive layer on a support member;
    providing a first film on the first adhesive layer;
    arranging a first semiconductor element on the first film;
    providing a first resin layer on the first film on which the first semiconductor element is arranged and forming a first substrate including the first semiconductor element and the first resin layer on the first film;
    simultaneously separating the first film and the first substrate from the first adhesive layer;
    providing a second film on the first adhesive layer from which the first substrate and the first film have been separated;
    arranging a second semiconductor element on the second film;
    providing a second resin layer on the second film on which the second semiconductor element is arranged and forming a second substrate including the second semiconductor element and the second resin layer on the second film; and
    simultaneously separating the second film and the second substrate from the first adhesive layer.

11. The method of manufacturing a semiconductor device according to claim 10,
    wherein the first film includes a first base layer and a second adhesive layer provided on at least one surface of the first base layer,
    wherein in the second film includes a second base layer and a third adhesive layer provided on at least one surface of the second base layer,
    wherein the first film is provided such that the second adhesive layer faces up in the providing the first film on the first adhesive layer, and
    wherein the second film is provided such that the third adhesive layer faces up in the providing the second film on the first adhesive layer.

12. The method of manufacturing a semiconductor device according to claim 10, further comprising
- separating the first film from the first substrate after the first substrate and the first film have been simultaneously separated from the first adhesive layer, and
- separating the second film from the second substrate after the second substrate and the second film have been simultaneously separated from the first adhesive layer.

13. The method of manufacturing a semiconductor device according to claim 10,
- wherein, in the providing second film, the first film that has been separated from the first substrate is used as the second film.

14. A method of manufacturing an electronic device comprising:
- providing an adhesive layer on a support member;
- providing a film on the adhesive layer;
- arranging a semiconductor element on the film;
- providing a resin layer on the film on which the semiconductor element is arranged and forming a substrate including the semiconductor element and the resin layer on the film;
- simultaneously separating the film and the substrate from the adhesive layer;
- separating the film from the substrate after the substrate and the film have been simultaneously separated from the adhesive layer;
- providing a wiring layer on a surface of the substrate from which the film has been separated, the wiring layer including a conductive part to be electrically connected to the semiconductor element;
- cutting the resin layer and the wiring layer at a position around the semiconductor element to obtain a semiconductor package that includes the semiconductor element, the resin layer, and the wiring layer; and
- mounting the semiconductor package to a circuit board.

* * * * *